(12) United States Patent
Chang et al.

(10) Patent No.: US 7,074,630 B2
(45) Date of Patent: Jul. 11, 2006

(54) METHOD OF FORMING LIGHT EMITTER LAYER

(75) Inventors: Ting-Chang Chang, Hsin-Chu (TW); Po-Tsun Liu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/441,189

(22) Filed: May 20, 2003

(65) Prior Publication Data

US 2004/0234745 A1 Nov. 25, 2004

(51) Int. Cl.
*H01L 21/00* (2006.01)

(52) U.S. Cl. ............... 438/22; 438/27; 438/48; 257/50; 257/51

(58) Field of Classification Search ......... 438/22, 438/27, 48, 31–38; 257/50–65
See application file for complete search history.

(56) References Cited

U.S. PATENT DOCUMENTS 6,157,047 A * 12/2000 Fujita et al. ............ 257/51
2002/0197831 A1 * 12/2002 Todd et al. ............. 438/528

* cited by examiner

*Primary Examiner*—Dung A. Le

(57) ABSTRACT

A light emitting layer including a quantum structure and the forming method of forming the same is provided. The forming method includes several steps. At first, a compound dielectric layer forms, including a dielectric layer and an impure dielectric layer, which comprises major elements and impurities. The compound dielectric layer is treated to drive the impurities to form the quantum structure in the dielectric layer according to the difference in characteristic between the major elements and impurities. For example, oxidizing the major elements to drive the impurities of the impure dielectric layer to form the quantum structure inside the dielectric layer, because the oxidizing capability of the major elements is stronger than that of the impurities. The quantum structure and compound dielectric layer construct the light emitting layer.

16 Claims, 3 Drawing Sheets

METHOD OF FORMING LIGHT EMITTER LAYER

BACKGROUND OF THE INVENTION

1. Field of the Invention

The present invention relates to a light emitting layer, and more particularly, to a forming method and a structure of a light emitting layer that includes a quantum structure.

2. Description of the Prior Art

The plane displays with whole colors and high brightness are the important future product in the photo-electric property under the image requirement of people. The light emitting component that emits light efficiently, i.e. the LED based on Si composition, is the best choice in the future of the light source of the plane display. For developing the whole color light sources, some investigators suggest to increase the emitting efficiency of light emitting layers due to the Quantum Confinement Effects by constructing porous Si and nanocrystalline Si from monocrystalline silicon. The nano-structure of the light emitting layers may be constructed from [top to down], i.e. Mechanical Milling, etched by etchant, or piling up atoms or molecules, or be constructed form [bottom to up], i.e. Gas Phase Condensation (GPC), Molecular Beam Epitaxy, or Combustion Flame-Chemical Vapor Condensation (CF-CVC). The prior methods of forming nano-structure of light emitting layers include some disadvantages, i.e. irregular quantum structure, lower producing efficiency, or additional, hard operating, and expensive devices yet.

So that it is necessary to improve the disadvantages of a quantum structure of light emitting layers in the prior art.

SUMMARY OF THE INVENTION

According to the above description of the background of the invention, it is one objective of the present invention to provide a forming method and a structure of a light emitting layer that is formed by original devices without buying or using any new devices.

It is another objective of the present invention to provide a forming method and a structure that decides the wavelength of the light of a light emitting layer by controlling the quantum structure in dimension.

It is a further objective of the present invention to provide a simple forming method to form a light emitting layer that includes the quantum structure.

It is a further objective of the present invention to provide a forming method and a structure that decides the intensity of the light of a light emitting layer by controlling the density of the quantum structure.

It is a further objective of the present invention to provide a forming method and a structure of a light emitting layer that emits light efficaciously.

It is a further objective of the present invention to provide a forming method and a structure of a light emitting layer that emits light with low operating voltage.

The present invention provides a forming method and a structure of a light emitting layer including quantum structure. The forming method includes several steps. At first, forming a compound dielectric layer on a semiconductor substrate. The compound dielectric layer includes a dielectric layer and an impure dielectric layer, which comprises major elements and impurities. Treating the compound dielectric layer to drive the impurities to form the quantum structure in the dielectric layer according to the difference in characteristic between the major elements and impurities. For example, oxidizing the major elements to drive the impurities of the impure dielectric layer to form the quantum structure inside the dielectric-layer because the oxidizing capability of the major elements is stronger than that of the impurities. After forming the quantum structure, the light emitting layer is formed. Afterward forming an up electrode and a down electrode by the prior technique to be a whole light emitting component.

All these advantageous features as well as others that are obvious from the following detailed description of preferred embodiments of the invention are obtained.

DESCRIPTION OF THE PREFERRED EMBODIMENT

In the present disclosure, the words "a" or "an" are to be taken to include both the singular and the plural. Conversely, any reference to plural items shall, where appropriate, include the singular.

The preferred embodiments of the present invention that provides a forming method and a structure of a light emitting layer included a quantum structure to improve the disadvantages in the prior art.

The present invention provides a forming method and a structure of a light emitting layer including quantum structure as the following steps. At first, a semiconductor substrate is provided, and then a compound dielectric layer is formed on an upper surface of the semiconductor substrate. The compound dielectric layer includes a dielectric layer and an impure dielectric layer, which comprises major elements and impurities. Treating the compound dielectric layer to drive the impurities to form the quantum structure in the dielectric layer according to the difference in characteristic between the major elements and impurities. For example, oxidizing the major elements to drive the impurities of the impure dielectric layer to form the quantum structure inside the dielectric layer because the oxidizing capability of the major elements is stronger than that of the impurities. After forming the quantum structure, the light emitting layer is formed. Afterward forming an up electrode on the compound dielectric layer and a down electrode on a down surface of the semiconductor substrate.

Figure 1A:
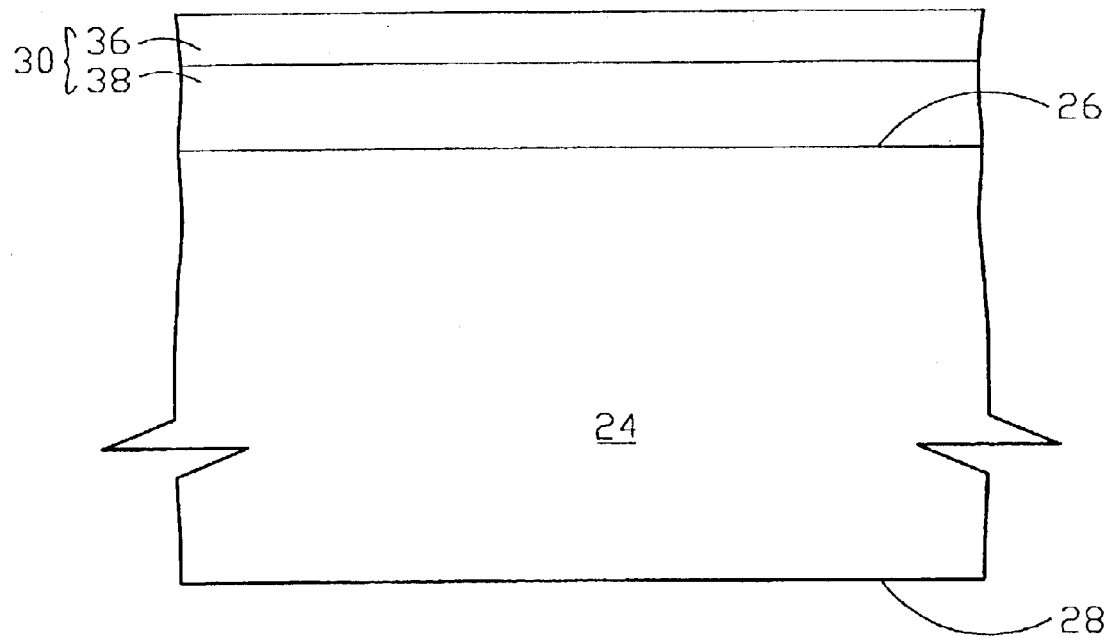
FIG. 1a and FIG. 1b are the flow diagrams of the first embodiment.

As shown in FIG. 1a, the first embodiment in the present invention is provided. Forming a dielectric layer 38, that is a silica layer, on the semiconductor substrate 24. Forming the impure dielectric layer 36 that has a plurality of major elements (not shown) and a plurality of impurities (not shown) contained on the dielectric layer 38. The dielectric layer 38 is disposed between the impure dielectric layer 36 and the semiconductor substrate 24. The dielectric layer 38 and the impure dielectric layer 36 constitute a compound dielectric layer 30.

Figure 1B:
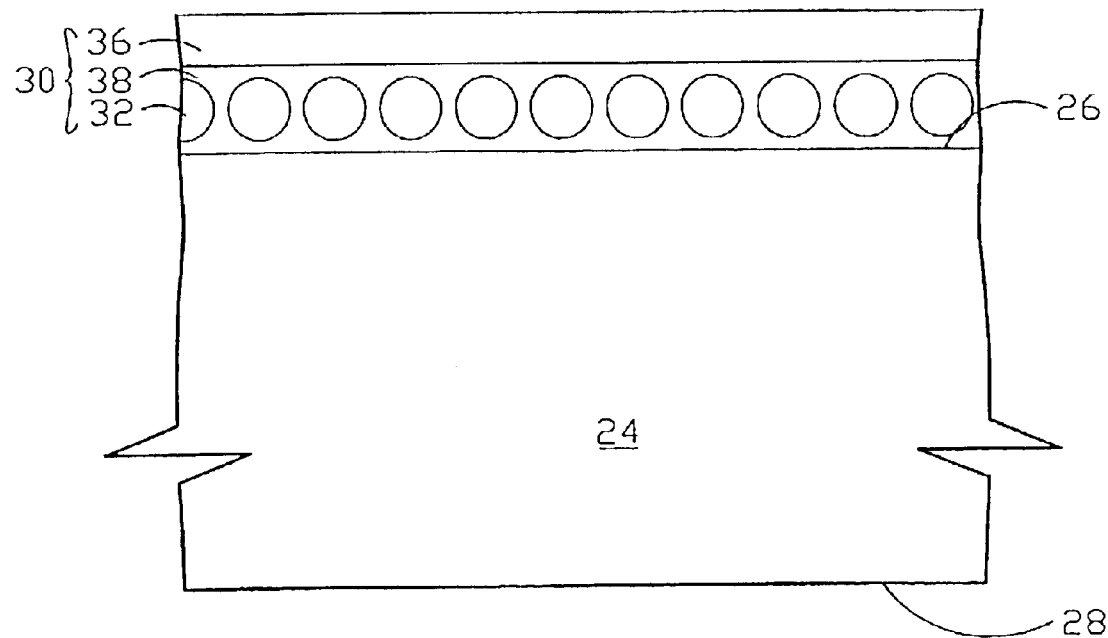

Treating the compound dielectric layer 30 to form a quantum structure such as a plurality of quantum dots 32, as shown in FIG. 1b, after the compound dielectric layer 30 was formed on the semiconductor substrate 24.

The impure dielectric layer 36 comprising the major elements that are Si atoms, and the impurities, that are Ge atoms, in this embodiment. The oxidizing capability of the major elements is stronger than that of the impurities of the impure dielectric layer 36, which means the oxidizing capability of Si atoms is stronger than that of Ge atoms. The impure dielectric layer 36 is a SiGe layer (silicon- germanium layer) in the first embodiment, and is formed by UHVCVD(Ultra High Vacuum Chemical Vapor Deposition) with two kinds of gases—$SiH_4$ and $GeH_4$, according to the chemical formula (1)

$$SiH_4+GeH_4 \rightarrow SiGe+4H_2 \qquad (1)$$

After forming the impure dielectric layer 36 on the dielectric layer 38, treating the impure dielectric layer 36 to oxidize the Si atoms in an environment being full of oxygen to drive the Ge atoms of the impure dielectric layer 36 to form the quantum structure. The Ge atoms are drove into the dielectric layer 38 to form the quantum dots because overwhelming majority of the Si atoms oxidizing but overwhelming majority of the Ge atoms, that having weaker oxidizing capability, non-oxidizing.

Forming an up electrode on the compound dielectric layer 30 and a down electrode on the down surface 28 of the semiconductor substrate 24 to form a whole light emitting layer by the prior technique after the quantum structure—the quantum dots 32 was formed.

The compound dielectric layer 30 was constructed by the dielectric layer 38 and the impure dielectric layer 36 before forming the quantum dots 32, and is constructed by the dielectric layer 38, the impure dielectric layer 36 and the quantum dots 32 after forming the quantum dots 32. Every quantum dot 32 is formed by Ge.

Because every quantum dot 32 is within the nanometer (nm) scale in dimension, approximately between 1 nm and 20 nm, the density of state of each quantum dot 32 changes as well as changing in dimension of the quantum dot 32 due to the Quantum Confinement Effects. Changing the quantum dot 32 in dimension controls the qualities, e.g. light quality, electric quality and the magnetic quality, of the quantum dot 32. For example, density of state of the quantum dots 32 reduces and separates as well as the quantum dots 32 becomes smaller in dimension, so that the energy gap increases to shorten the wavelength of the emitted light. In one word, the dimension of the quantum dots 32 decides the wavelength of the emitted light. The distribution of density of the quantum dots 32 of the compound dielectric layer 32 decides the intensity of the emitted light. The higher distribution of density of the quantum dots 32 of the compound dielectric layer 32, the higher luminous intensity of emitted light is. Of course, controlling the amount of the impurities in the impure dielectric layer 36 to control the quantum dots 32 in dimension and the distribution of density of the quantum dots 32 is a way for procuring different purposes. As discussed above, the present invention provides a simple forming method of forming a light emitting layer with a quantum structure by original devices without buying or using any new devices according to the difference in characteristic, e.g. the oxidizing capability, between the major elements and impurities.

Figure 2A:
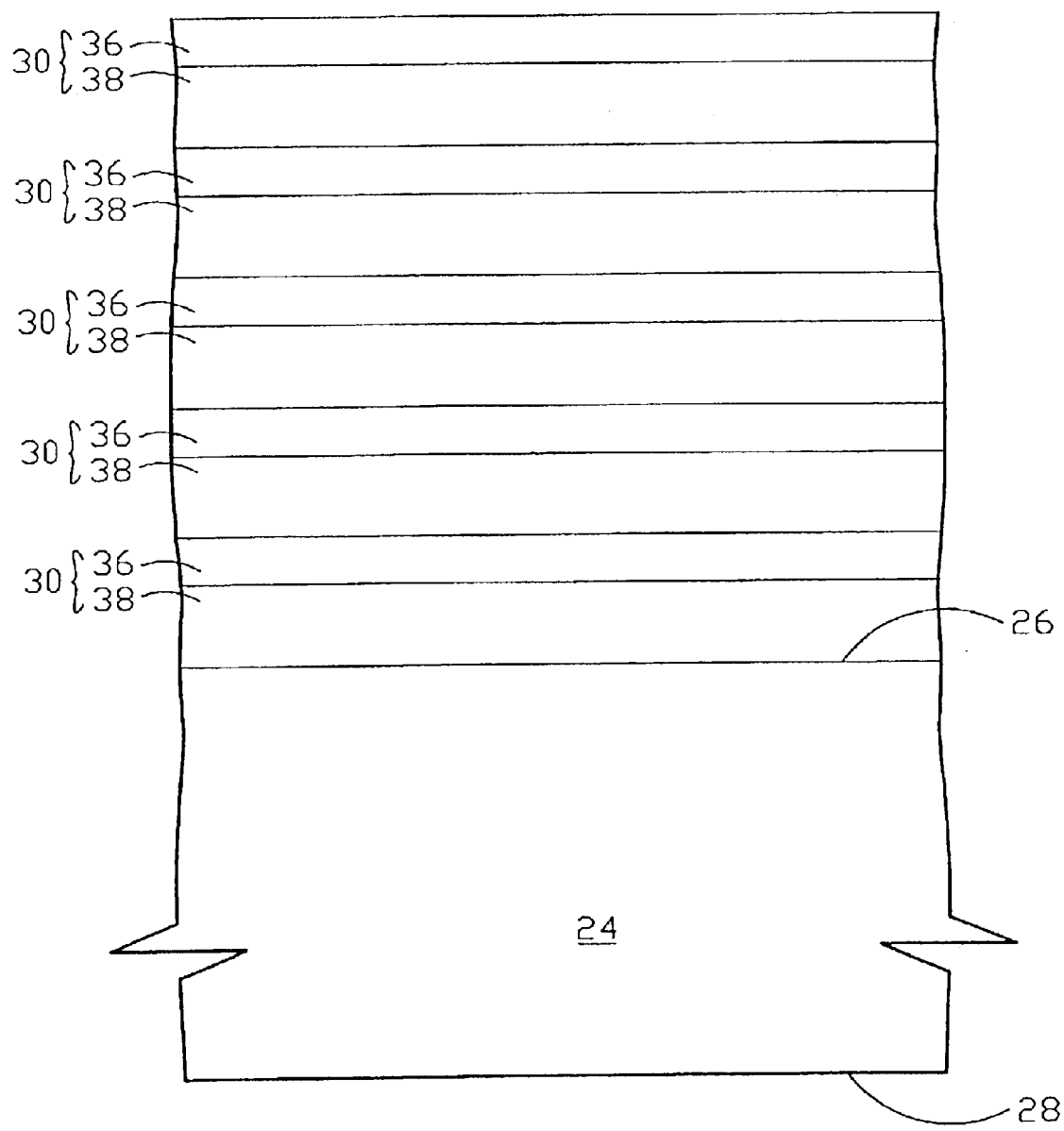
FIG. 2a and FIG. 2b are the flow diagrams of the second embodiment.

As shown in FIG. 2a, the second embodiment in the present invention is provided. Forming a dielectric layer 38, that is a silica layer, on the semiconductor substrate 24. The impure dielectric layer 36, preferred to be a $SiGeO_2$ layer that includes $O_2$, Si atoms (major elements) and Ge atoms (impurities), is formed on the semiconductor substrate 24. The dielectric layer 38 is disposed between the impure dielectric layer 36 and the semiconductor substrate 24. The compound dielectric layer 30 is consisted of the dielectric layer 38 and the impure dielectric layer 36. Interchanging forming a plurality of dielectric layers 38 and a plurality of compound dielectric layers 36 on the compound dielectric layer 30 that had formed, as shown in FIG. 2a.

The impure dielectric layer 36 is formed by UHVCVD (Ultra High Vacuum Chemical Vapor Deposition) with three kinds of gases—$O_2$, $SiH_4$ and $GeH_4$, according to the chemical formula (2):

$$SiH_4+GeH_4+O_2 \rightarrow SiGeO_2+4H_2 \qquad (2)$$

The oxidizing capability of the major elements is stronger than that of the impurities, i.e. the oxidizing capability of Si atoms is stronger than that of Ge atoms to produce a quantum structure as the following treating step.

Figure 2B:
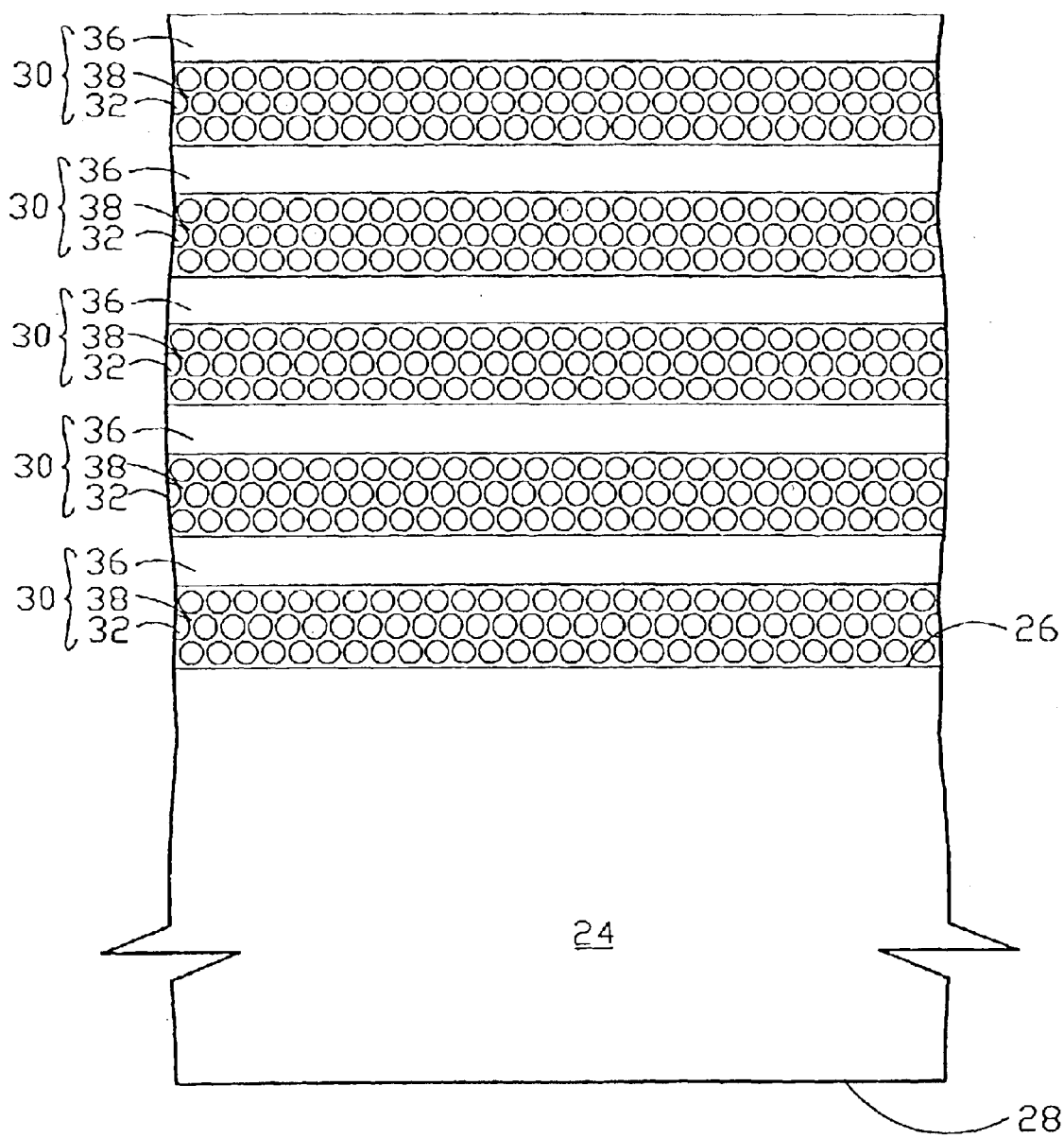

Treating the impure dielectric layer 36—$SiGeO_2$ layer in an environment without oxygen, to oxidize the Si atoms with the oxygen atoms of the $SiGeO_2$ layer. Then, thermal annealing the compound dielectric layer 30 to drive the Ge atoms of the impure dielectric layer 38 in the dielectric layer 38 to form the quantum structure, as shown in FIG. 2b, wherein the light emitting layer is formed. The Ge atoms are drove into the dielectric layer 38 to form the quantum atoms, because overwhelming majority of the Si atoms (major elements) oxidizing with the oxygen atoms of the impure dielectric layer 36 but overwhelming majority of the Ge atoms (impurities), that having weaker oxidizing capability, non-oxidizing.

Similarly, forming an up electrode on the last formed compound dielectric layer 30, and a down electrode on the down surface 28 of the semiconductor substrate 24 to be a whole light emitting component.

Each compound dielectric layer 30 was constructed by a dielectric layer 38 and an impure dielectric layer 36 before forming the quantum dots 32, and is constructed by the dielectric layer 38, the impure dielectric layer 36 and quantum dots 32 after forming the quantum dots 32. Every quantum dot 32 is formed by Ge. The whole light emitting component is constructed by the $SiO_2$ layer, the quantum dots 32 that are formed in compound dielectric layers 30, the up electrode and the down electrode.

Because every quantum dot 32 is within the nanometer (nm) scale in dimension, approximately between 1 nm and 20 nm, the density of state of each quantum dot 32 changes as well as changing in dimension of the quantum dot 32 due to the Quantum Confinement Effects. Changing the quantum dot 32 in dimension controls the qualities, e.g. light quality, electric quality and the magnetic quality, of the quantum dot 32. For example, density of state of the quantum dots 32 reduces and separates as well as the quantum dots 32 becomes smaller in dimension, so that the energy gap increases to shorten the wavelength of the emitted light. In one word, the dimension of the quantum dots 32 decides the wavelength of the emitted light. The distribution of density of the quantum dots 32 of the compound dielectric layer 32 decides the intensity of the emitted light. The higher distribution of density of the quantum dots 32 of the compound dielectric layer 32, the higher luminous intensity of emitted light is. Of course, controlling the amount of the impurities in the impure dielectric layer 36 to control the quantum dots 32 in dimension and the distribution of density of the quantum dots 32 is a way for procuring different purposes. As discussed above, the present invention provides a simple forming method of forming a light emitting layer with a quantum structure by original devices without buying or using any new devices according to the difference in characteristic, e.g. the oxidizing capability, between the major elements and impurities. Particularly, the SiGe quantum dots 32 can be produced by reducing the amount of $O_2$ of the impure dielectric layer 36 to limit some Si atoms to oxidize with the un-sufficient oxygen atoms. For example, if the impure dielectric layer 38 is a $SiGeO_x$ layer, where the x<2, portions of Si atoms can not be oxidized to be the $SiO_2$ during the oxidizing process, and these Si atoms and some Ge atoms will be drive to be the SiGe quantum dots 32 together.

The configuration and the distribution of the quantum structure are not limited by the described preferred embodiments. The configuration of the quantum structure is a plurality of quantum dots 32 and the distribution is a single layer. For example, the configuration and the distribution will change, i.e. the distribution of the single-layer quantum dots 32 will change to be the multiple-layer quantum dots 32, as shown in the FIG. 2b, according to some purposes and factors, e.g. different configuration or different composition of the quantum structure.

The preferring embodiments in the present invention provides a light emitting layer with a quantum structure to decide the wavelength of the emitted light by deciding the quantum dots 32 in dimension, and decide the intensity of the light by deciding the density of the quantum structure. The light emitting layer in the present invention also emits light efficaciously, because the electrons and holes, that exist during the 3D energy barrier in the quantum dots 32, recombine to each other easily. Another advantage of the light emitting layer in the present invention is the lower operating voltage.

Besides, the present invention provides a forming method and a structure of a light emitting layer that is formed by original devices without buying or using any new devices, and is formed by plain steps.

The quantum structure of the above described is a plurality of quantum dots, that are formed due to the difference in the oxidizing capability between the Si atoms and Ge atoms. The above description only to demonstrate and illustrate the preferred embodiments of the present invention, not to limit the scope of the present invention to what described detailed herein; and any equivalent variations and modifications in the present invention should be within the scope of the claims hereafter.

What is claimed is:

1. A method of forming a light emitting layer, comprising:
    forming a compound dielectric layer including a dielectric layer and an impure dielectric layer, said impure dielectric layer comprising a plurality of major elements and a plurality of impurities, wherein the oxidizing capability of said major elements is stronger than that or said impurities; and
    driving said impurities to form a quantum structure in said dielectric layer.

2. The method according to claim 1, wherein said major elements are silicon atoms or the material that consists of the chemical compound of silicon atoms.

3. The method according to claim 1, wherein said impurities are germanium atoms.

4. The method according to claim 1, wherein said impurities are germanium atoms.

5. The method according to claim 1, wherein driving said impurities comprises oxidizing said major elements in an environment that is full of oxygen to drive said impurities to form said quantum structure in said dielectric layer.

6. The method according to claim 1, wherein said impure dielectric layer is a layer that includes oxygen atoms.

7. The method according to claim 6, wherein said impure dielectric layer is a $SiGeO_2$ layer.

8. The method according to claim 6, wherein driving said impurities comprises oxidizing said major elements with said oxygen atoms of said compound dielectric layer in an environment without oxygen to drive said impurities to form said quantum structure in said dielectric layer.

9. The method according to claim 8, wherein driving said impurities further comprises thermal annealing said compound dielectric layer in said environment without oxygen.

10. The method according to claim 1, wherein forming said compound dielectric layer comprises interchanges forming a plurality of dielectric layers and a plurality of impure dielectric layers on said formed compound dielectric layer.

11. The method according to claim 1, wherein forming said compound dielectric layer comprises forms said dielectric layer between a semiconductor substrate and said impure dielectric layer.

12. The method according to claim 1, wherein said impure dielectric layer is a SiGe layer.

13. The method according to claim 1, wherein said quantum structure is approximately between 1–20 nm in dimension.

14. The method according to claim 1, further comprising control the amount of said impurities of said compound dielectric layer to control said quantum structure in dimension.

15. The method according to claim 1, wherein said quantum structure is a plurality of quantum dots.

16. A method of forming a light emitting layer, comprising:
    providing a semiconductor substrate;
    forming a compound dielectric layer on said semiconductor substrate, said compound dielectric layer including a dielectric layer and a $SiGeO_2$ layer;
    interchanging forming a plurality of dielectric layers and a plurality of impure dielectric layers on said formed compound dielectric layer; and
    treating said $SiGeO_2$ layer in an environment without oxygen to oxidize said Si atoms with said oxygen atoms of said $SiGeO_2$ layer and to drive said Ge atoms of said $SiGeO_2$ layer in said dielectric layer to form a quantum structure.

* * * * *